(12) United States Patent
Trevelyan

(10) Patent No.: US 6,943,623 B2
(45) Date of Patent: Sep. 13, 2005

(54) AMPLIFICATION CIRCUITRY

(75) Inventor: Philip Trevelyan, Camberley (GB)

(73) Assignee: Nokia Corporation, Espoo (FI)

( * ) Notice: Subject to any disclaimer, the term of this patent is extended or adjusted under 35 U.S.C. 154(b) by 105 days.

(21) Appl. No.: 10/457,950

(22) Filed: Jun. 9, 2003

(65) Prior Publication Data

US 2004/0036531 A1 Feb. 26, 2004

Related U.S. Application Data

(60) Provisional application No. 60/402,836, filed on Aug. 12, 2002.

(30) Foreign Application Priority Data

Jun. 11, 2002 (GB) .............................................. 0213352

(51) Int. Cl.[7] .............................................. H03F 1/24
(52) U.S. Cl. ......................................... 330/100; 330/10
(58) Field of Search .................................. 330/100, 10

(56) References Cited

U.S. PATENT DOCUMENTS

| | | | |
|---|---|---|---|
| 4,004,246 A | | 1/1977 | Hamada ........................ 330/10 |
| 4,535,399 A | | 8/1985 | Szepesi ......................... 363/41 |
| 6,480,704 B1 | * | 11/2002 | Pakonen ....................... 455/126 |
| 6,768,376 B2 | * | 7/2004 | Hoyt et al. .................... 330/10 |
| 2003/0227342 A1 | * | 12/2003 | Liu .............................. 332/145 |

FOREIGN PATENT DOCUMENTS

WO WO-01/71905 A2 9/2001

* cited by examiner

*Primary Examiner*—Patricia Nguyen
(74) *Attorney, Agent, or Firm*—Harrington & Smith, LLP

(57) ABSTRACT

Amplification circuitry for driving a load in response to an input signal, comprising: a phase locked loop, for producing a pulse width modulated signal for driving the load and input circuitry arranged to control the phase locked loop and vary the pulse width modulated signal in response to the input signal.

18 Claims, 2 Drawing Sheets

AMPLIFICATION CIRCUITRY

CROSS REFERENCE TO A RELATED APPLICATION

This patent application claims priority under 35 U.S.C. 119(e) from U.S. Provisional Application No. 60/402,836 filed Aug. 12, 2002, incorporated by reference herein.

The present invention relates to amplification circuitry for driving a load in response to a control signal. Embodiments of the invention relate to class D audio amplification.

Amplifiers are commonly used to drive loads such as loud speakers. However, the amplification circuitry itself may introduce noise into the output of the loud speaker.

Class D amplifiers are efficient and are easy to integrate within existing silicon substrates. This gives them a significant advantage over existing commonly used amplifiers which, because of their inefficiency, produce large amounts of heat and therefore must be produced as discrete components. However, class D amplifiers have poor power supply rejection. That is, electrical noise on the power supply of the class D amplifier significantly affects the output of the amplifier. Another problem with Class D amplification, is that it requires pulse width modulated (PWM) signals to drive the amplification circuitry. When the width of the pulses become very narrow, the PWM signal contains high frequency components which may be a source of interference with other nearby electronic devices.

It would therefore be desirable to provide improved amplification circuitry.

According to one aspect of the present invention there is provided amplification circuitry for driving a load in response to an input signal, comprising: a phase locked loop, for producing a pulse width modulated signal for driving the load and input circuitry arranged to control the phase locked loop and vary the pulse width modulated signal in response to the input signal.

According to one embodiment, the input circuitry comprises control means, arranged within the phase locked loop to have negative feedback and to receive the input signal. This addresses the problem of noise introduced by is input into the voltage controlled oscillator 16.

The inverting amplifier 30 comprises an operational amplifier 18, a DC voltage supply 20, an input resistor 22 and a feedback resistor 24. The output of the operational amplifier 18 provides the control signal 19. The non-inverting input of the operational amplifier 18 receives a DC voltage signal 21 from the DC voltage supply 20. One end of the feedback resistor 24 is connected to the inverting input of the operational amplifier 18 and the other end receives the voltage signal 27 from the phase-voltage converter 26. One end of the input resistor 22 is also connected to the inverting input of the operational amplifier 18 and the other end is connected to receive the input signal 23.

Thus the inverting amplifier 30, the voltage controlled oscillator 16, the phase detector 10, the class D audio amplifier 8 and the phase-voltage converter 26 are connected to form a loop. This loop operates as both a negative feedback loop controlled by the inverting amplifier 30 and also as a phase locked loop 28 controlled by the phase locked loop components 28: reference clock source 14, voltage controlled oscillator 16, phase detector 10 and phase-voltage converter 26.

The operation of the phase locked loop 28 is such that, in the steady state, the variable phase signal 17 output from the voltage controlled oscillator 16 has the same frequency as (but a phase offset from) the reference clock signal 15. The phase locked loop 28 is driven by the input circuit comprising the inverting amplifier 30. The phase offset between the variable phase signal 17 and the reference clock signal 15 varies in dependence on the control signal 19, which in turn depends upon the input electrical signal 23.

The inverting amplifier 30 operates to maintain the voltage at its inverting input at the same voltage as its non-inverting input. The control signal 19 produced by the inverting amplifier 30 is such that the voltage signal 27 received by the inverting amplifier 30 maintains the voltage at the inverting input at the same voltage as the non-inverting input. The control signal 19 will the amplification circuitry.

According to another embodiment, the pulse width modulation signal is a square wave signal varying between a first voltage level and a second voltage level, and the input circuitry comprises means for changing the first and/or second voltage level. This addresses the problems causes by pulse width modulated signals having narrow pulses.

According to another aspect of the present invention there is provided amplification circuitry for driving a load in response to an input signal, comprising: pulse width modulation circuitry, for producing a pulse width modulated signal for driving the load and input circuitry arranged to have negative feedback from the pulse width modulation circuitry and to vary the pulse width modulated signal in response to the input signal.

According to a further aspect of the present invention there is provided amplification circuitry comprising: an amplifier having an output for driving a load and an input; a filter connected to the output of the amplifier having an impedance substantially the same as the load; and a negative feedback circuit connected between the filter and the input of the amplifier and having as an input an audio signal for production on the loudspeaker.

For a better understanding of the present invention, reference will now be made by way of example only to the following drawings in which.

Figure 1:
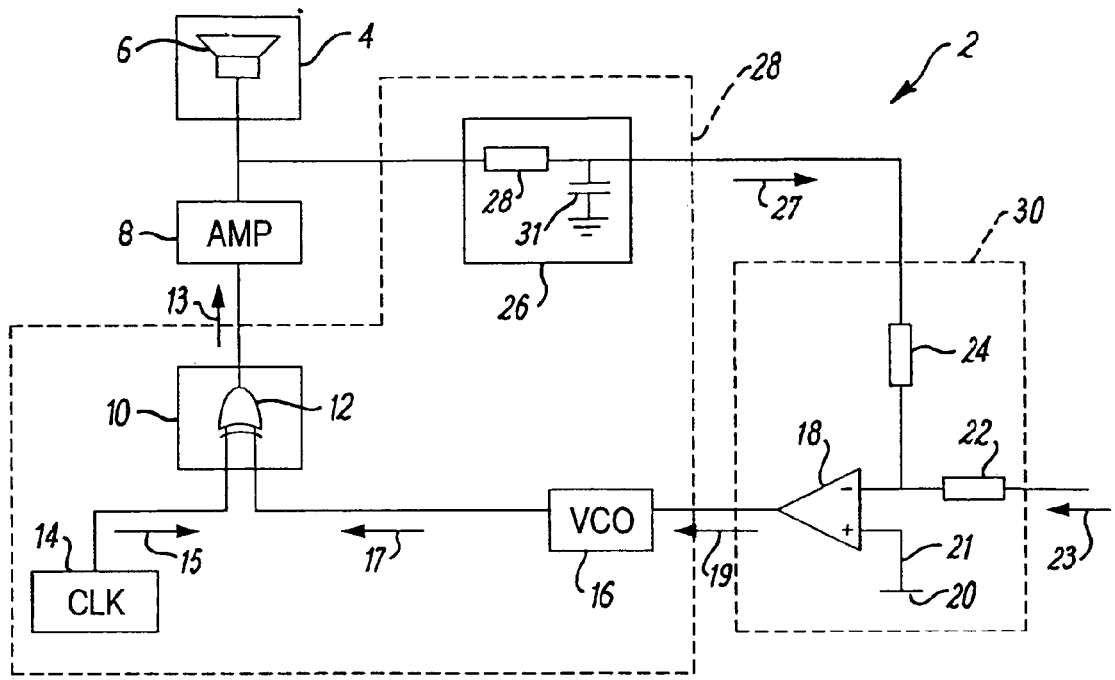
FIG. 1 is a schematic illustration of amplification circuitry according to an embodiment of the present invention.

FIG. 1 illustrates amplification circuitry 2 which receives an input electrical signal 23 and drives a load 4. In this example the input electrical signal 23 is a time varying analogue signal representing audible sound and consequently has a frequency of the order of 10 kHz and the load is a loud speaker 6. The amplification circuitry 2 comprises a class D audio amplifier 8 which may be an H bridge or a half H bridge; a phase detector 10 which in this example is an exclusive OR gate 12; a reference clock source 14; a voltage controlled oscillator 16; an inverting amplifier 30 forming part of an input circuit with negative feedback; and a phase-voltage converter 26.

The reference clock source 14 produces a reference clock signal 15. This signal is a periodic square wave which has a fixed frequency and a fixed phase. The frequency is typically in the range of 100s of kHz and preferably between 200 and 300 kHz. The reference clock signal 15 is applied as one input to the exclusive OR gate 12 of the phase detector 10.

The voltage controlled oscillator 16 produces a variable phase signal 17. The variable phase signal 17 is a square wave signal. The variable phase signal 17 forms the second (and final) input to the exclusive OR gate 12.

The output of the phase detector 10 (exclusive OR gate 12) is a pulse width modulated (PWM) signal 13. The PWM signal 13 is provided as an input to the class D audio amplifier 8. The output of the class D audio amplifier 8 is connected to the load 4 which in this case is the loud speaker 6 and it is also connected to the phase-voltage converter 26.

The phase-voltage converter 26 comprises a resistor 28 and a capacitor 31 connected as a low pass filter. The resistor 28 is connected between an input and an output of the phase-voltage converter 26 and the capacitor 31 is connected between the output and ground. The output voltage signal 27 developed across the capacitor 31 is provided to the inverting amplifier 30 which also receives the input signal 23 and produces a control signal 19 which is input into the voltage controlled oscillator 16.

Let us first consider the situation in which the class D audio amplifier 8 does not introduce any error components into its output. In this situation, the control signal 19 is an inverted and amplified version of the input signal 23. The voltage controlled oscillator 16 converts the voltage value of the control signal 19 into a variable phase signal 17 which has the frequency of the reference clock source 14 but has been phase shifted in proportion to the voltage value of the control signal 19. The exclusive OR gate 12 takes the variable phase signal 17 and the reference clock signal 15 and produces the pulse width modulated signal 13. If the variable phase signal 17 and the reference clock signal 15 are in phase the pulse width modulated signal 13 is at a constant low voltage, if the variable phase signal 17 and the reference clock signal 15 are 180° out of phase then the pulse width modulated signal 13 is at a constant high value, and if the variable phase signal 17 and the reference clock signal 15 are 90° out of phase the pulse width modulated signal 13 has a 50% duty cycle. Therefore, as the input signal 23 varies the width of the positive portions of the pulse width modulated signal 13 varies.

The pulse width modulated signals 13 drive the load 4 via the class D audio amplifier 8. The periodic output of the class D audio amplifier 8 is also provided to the phase-voltage converter 26 which integrates it to produce the voltage signal 27 which is non-periodic and corresponds to an inverted version of the input electrical signal 23. The characteristics of the phase-voltage converter, that is the resistance value and the capacitance value, are chosen so that it closely emulates the acoustic load of the loud speaker 6. Consequently, the voltage signal 27 is an electrical signal representative of the output of the loud speaker 6. This signal is received via the feedback resistor 24 of the inverting input of the operation amplifier 18.

As the input signal 23 increases, the positive duty cycle of the pulse width modulation signal 13 decreases and the voltage signal 27 (dependent upon the integral of the pulse width modulation signal 13) decreases. As the input signal 23 decreases, the positive duty cycle of the pulse width modulation signal 13 increases and the voltage signal 27 (dependent upon the integral of the pulse width modulation signal 13) increases. Thus there is a negative feedback circuit created which allows the pulse width modulated signal 13 to be varied in accordance with the input signal 23.

If one now considers the situation in which the class D audio amplifier 8 introduces an error signal into its output. The voltage signal 27 will be modified to include both the signal representing the input electrical signal 23 and the error signal. The presence of the error signal in the voltage signal 27 causes the control signal 19 output by the operational amplifier 18 to vary such that the inverting input of the operational amplifier 18 remains at the DC voltage supply 20. This compensation in the control signal 19 causes a phase shift in the variable phase signal 17 which in turn causes a change in the duty cycle of the pulse width modulated signal 13 such that the output of the class D audio amplifier 18 is compensated to remove the error. Thus the described amplification circuitry 2, dynamically removes errors produced by the amplification circuitry 8.

Figure 2:
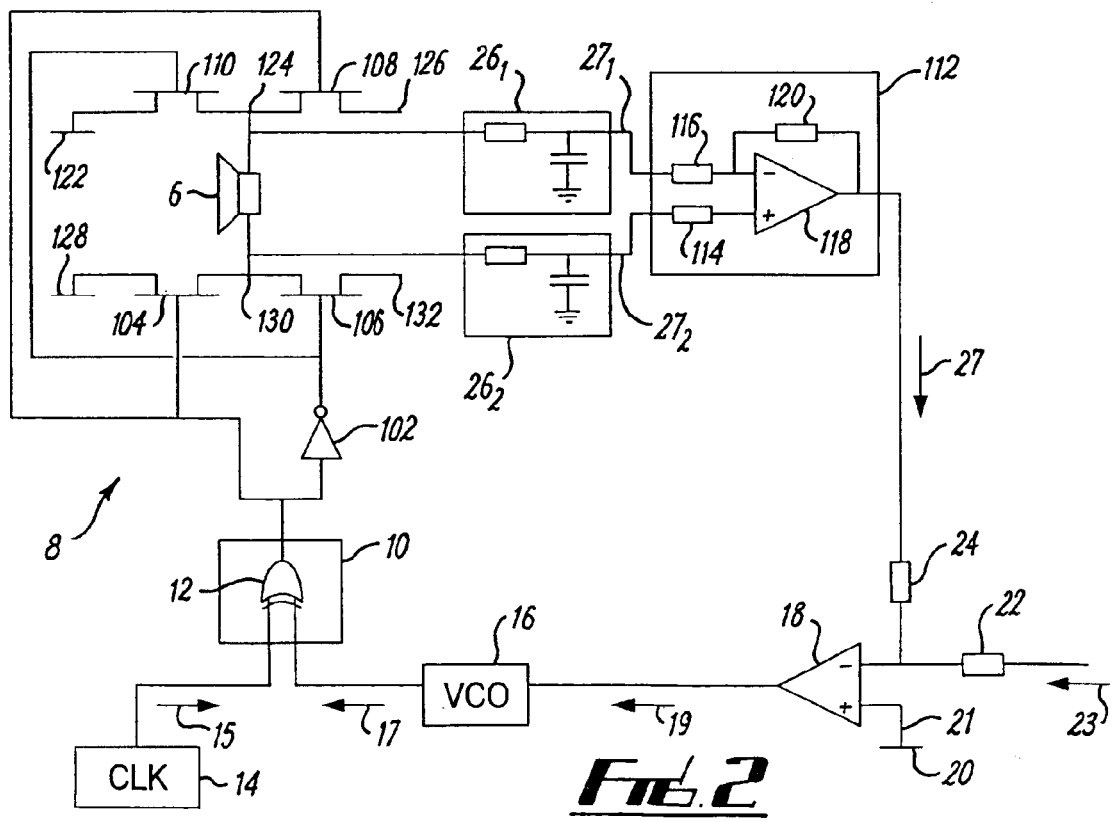
FIG. 2 is a schematic illustration of amplification circuitry according to a second embodiment of the present invention which uses an H bridge.

FIG. 2 illustrates a second embodiment of the present invention. Like numerals refer to like features. The figure differs from that shown in FIG. 1, in that a particular class D audio amplifier 8 is illustrated, in this case an H bridge. The H bridge 8 produces a differential output and each one of the outputs has its own phase-voltage converter $26_1$ and $26_2$. The first and second voltage signals $27_1$ and $27_2$ output from the respective phase-voltage converters $26_1$ and $26_2$ are combined into a single voltage signal 27 in combination circuitry 112. The H bridge 8 comprises a first bridge driver having a first common node 124 connected to one input of the loud speaker 6 and a second bridge driver 124 having a second common node 130 connected to a second input of the loud speaker 6. The first bridge driver comprises a first switching FET 110 with its channel connected between a first voltage supply 122 and the first common node 124 and a second FET switching transistor 108 with its channel connected between the first common node 124 and a second voltage supply 126. The gate of the first switching transistor 110 is connected to the output of an inverter 102 which receives an input from the phase detector 10 and the gate of the second switching transistor 108 is connected to the output of the phase detector 10. The second bridge driver comprises a third FET transistor 104 with its channel connected between the first voltage source 128 and the second common node 130 and a fourth FET switching transistor 106 with its channel connected between the second common node 130 and the second voltage supply 132. The gate of the third switching transistor 104 is connected to the output of the phase detector 10 and the gate of the fourth switching transistor 106 is connected to the output of the inverter 102. The first common node is connected to the first phase-voltage converter $26_1$ which produces a first voltage signal $27_1$ and the second common node 130 is connected to the second phase-voltage converter $26_2$ which produces a second voltage signal $27_2$. The conversion circuitry 112 receives the first voltage signal $27_1$ and the second voltage signal $27_2$ and comprises a differential amplifier 118. The inverting input is connected to receive the first voltage signal $27_1$ via a resistor 116 and is additionally connected to the output of the differential amplifier 118 via a resistor 120. The non-inverting input of the differential amplifier is connected to receive the second voltage signal $27_2$ via a resistor 114. The output of the differential amplifier 118 is the voltage signal 27.

Figure 3:
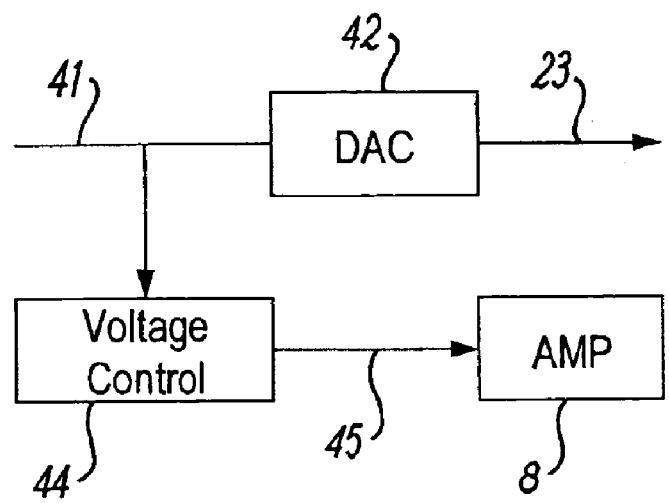
FIG. 3 is a schematic illustration of circuitry used to control the height of a pulse width modulated signal.

FIG. 3 illustrates an input portion of amplification circuitry 2 suitable for use in a digital electronic device. A digital input signal 41 representing an audio signal is converted via a digital to analogue converter 42 into an (analogue) input electrical signal 23. Voltage control circuitry 44 is additionally connected to receive the digital input signal 41. This circuitry analyses the amplitudes of the audio signal represented by input digital signal 41. If the amplitude of the audio signal falls below a threshold, it reduces the height of the signal provided to the phase-voltage converter 26. This is achieved by voltage control circuitry 44 which provides a voltage control signal 45 to the class D audio amplifier 8. If the amplitude of the input audio signal falls below a threshold, the voltage control signal 45 reduces the supply voltage to the class D audio amplifier 8.

Referring back to FIG. 1, the voltage signal 27 represents the integral of the pulse width modulated signal 13. Consequently, if the height of the input signal to the phase-voltage converter 26 is decreased the circuit will operate to maintain the value of the voltage signal 27, that is the width of the pulses of the pulse width modulated signal 13 will increase to maintain the integrated value of the pulse width modulated signal 13. Consequently, pulse width modulated signals with very high frequency components can be avoided thus minimising the effects of interference between the amplification circuitry 2 and other electronic circuitry, for example radio frequency circuitry in a mobile phone.

Figure 4:
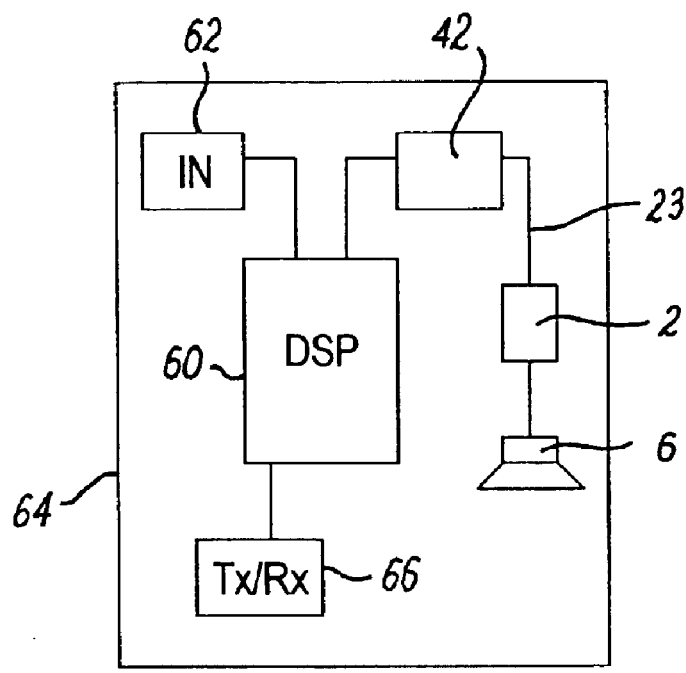
FIG. 4 is a schematic illustration of a mobile phone.

FIG. 4 illustrates a mobile phone 64 comprising radio frequency transceiver circuitry 66, digital signal processing circuitry 60, input circuitry 62, amplification circuitry 2, digital to analogue converter 42 and loud speaker 6. The digital signal processor 60 receives an input from the input circuitry 62, receives an input and provides an output to the radio frequency transceiver circuitry 66 and provides an output to digital analogue conversion circuitry 42 which in turn provides an analogue input electrical signal 23 to amplification circuitry 2, which in turn drives the loud speaker 6.

Although the present invention has been described in the preceding paragraphs with reference to various examples, it should be appreciated that modifications and variations to the examples given can be made without departing from the scope of the invention as claimed.

Whilst endeavouring in the foregoing specification to draw attention to those features of the invention believed to be of particular importance it should be understood that the Applicant claims protection in respect of any patentable feature or combination of features hereinbefore referred to and/or shown in the drawings whether or not particular emphasis is placed thereon.

What is claimed is:

1. Amplification circuitry for driving a load in response to an input signal, comprising:
   a phase locked loop including pulse width modulation circuitry, for producing a pulse width modulated signal for driving the load and
   input circuitry arranged to control the phase locked loop and vary the pulse width modulated signal in response to the input signal.

2. Amplification circuitry as claimed in claim 1 wherein the input circuitry comprises control means, arranged within the phase locked loop to have negative feedback and to receive the input signal.

3. Amplification circuitry as claimed in claim 1 wherein the phase locked loop comprises a voltage controlled oscillator arranged to receive an input dependent upon the input circuitry, a phase detector arranged to receive an input dependent upon the voltage controlled oscillator and a phase-voltage converter arranged to receive an input dependent upon the phase detector and wherein the input circuitry is arranged to receive a first input dependent upon the control signal and a second input dependent upon the phase-voltage converter.

4. Amplification circuitry as claimed in claim 1 wherein the input circuitry comprises an operational amplifier.

5. Amplification circuitry as claimed in claim 1 wherein the phase locked loop comprises a voltage controlled oscillator arranged to receive an input dependent upon the input circuitry and a phase detector arranged to receive an input dependent upon the voltage controlled oscillator and to produce the pulse width modulated signal.

6. Amplification circuitry as claimed in claim 5 further comprising a reference clock for providing a square wave signal as a first reference input to the phase detector and wherein the voltage controlled oscillator provides a square wave signal as a second input to the phase detector.

7. Amplification circuitry as claimed in claim 1 further comprising a class D amplifier for receiving the pulse width modulated signal and for driving the load.

8. Amplification circuitry as claimed in claim 7 wherein the class D amplifier comprises a H or half-H bridge.

9. Amplification circuitry as claimed in claim 1 wherein the pulse width modulation signal is a square wave signal varying between a first voltage level and a second voltage level, and wherein the input circuitry comprises means for changing the first and/or second voltage level.

10. Amplification circuitry as claimed in claim 9 wherein the input circuitry is arranged to detect when the amplitude of the control input signal falls below a threshold value and to change the first and/or second voltage level.

11. Amplification circuitry for driving a load in response to an input signal, comprising:
    pulse width modulation circuitry, for producing a pulse width modulated signal for driving the load and
    input circuitry arranged to have negative feedback from the pulse width modulation circuitry and to vary the pulse width modulated signal in response to the input signal.

12. Amplification circuitry as claimed in claim 11 further comprising a filter connected in a feedback path between the pulse width modulation circuitry and the input circuitry to filter a signal dependent upon the pulse width modulation signal.

13. Amplification circuitry as claimed in claim 12, wherein the pulse width modulation circuitry and filter form component parts of a phase locked loop.

14. Amplification circuitry comprising:
    an amplifier having an output for driving a load and an input;
    a filter connected to the output of the amplifier having an impedance substantially the same as the load; and
    a negative feedback circuit connected between the filter and the input of the amplifier and having as an input an audio signal for production on the loudspeaker.

15. Amplification circuitry as claimed in claim 14 wherein the load is a loudspeaker and filter is designed to emulate acoustic load of the loudspeaker.

16. A mobile phone comprising amplification circuitry as claimed in claim 1.

17. A mobile phone comprising amplification circuitry as claimed in claim 11.

18. A mobile phone comprising amplification circuitry as claimed in claim 14.

* * * * *